United States Patent [19]

Jordan

[11] Patent Number: 4,571,548

[45] Date of Patent: Feb. 18, 1986

[54] FLOATING LIMITER CIRCUIT

[75] Inventor: Lavell Jordan, Minnetonka, Minn.

[73] Assignee: Honeywell Inc., Minneapolis, Minn.

[21] Appl. No.: 465,954

[22] Filed: Feb. 14, 1983

[51] Int. Cl.⁴ .................. H04B 15/00; H04B 1/10
[52] U.S. Cl. .................................. 328/167; 328/171;
307/543; 307/551; 307/562; 455/296; 455/308
[58] Field of Search .............. 328/162, 165, 167, 171,
328/175, 169; 307/542, 543, 546, 547, 548, 550,
555, 556, 565; 455/308, 309, 296

[56] References Cited

U.S. PATENT DOCUMENTS

| | | | |
|---|---|---|---|
| 3,344,284 | 9/1967 | Thompson | 307/542 |
| 3,541,459 | 11/1970 | Webb | 328/171 |
| 3,737,678 | 6/1973 | Dolby et al. | 307/548 |
| 4,204,170 | 5/1980 | Kage | 328/165 |
| 4,256,975 | 3/1981 | Fukushima et al. | 307/543 |
| 4,271,535 | 6/1981 | Fukuhara et al. | 455/309 |

Primary Examiner—Stanley D. Miller
Assistant Examiner—Loha Ben
Attorney, Agent, or Firm—Albin Medved

[57] ABSTRACT

A floating limiter circuit for reducing interference from high frequency, very large pulses or fast rise time pulses, without distorting the desired signal. The reference voltage for the limiter circuit is established by the envelope of the desired output signal, thereby allowing the desired signal to vary over a wide dynamic range.

2 Claims, 3 Drawing Figures

FLOATING LIMITER CIRCUIT

BACKGROUND OF THE INVENTION

The present invention relates to a limiter circuit which greatly reduces the interference from pulsed transmitters, without distorting the desired signal.

Prior art limiter circuits have shortcomings in that they either limit the dynamic range of the desired signal or they can not handle pulses with large amplitude or fast rise times. Also, prior art circuits tend to distort the desired signal because the interference pulses are not eliminated from the reference signal with respect to which the instantaneous signal is limited.

SUMMARY OF THE INVENTION

An object of the present invention is to provide a limiter circuit for reducing the interference from large amplitude or fast rise time pulses without distorting the desired signal and at the same time allowing the desired signal to vary over a wide dynamic range.

By referencing the limiter circuit to the desired instantaneous signal, the desired signal is not prevented from varying over a very wide dynamic range. Very large or fast rise pulses are limited, however, to a predetermined voltage variation from the instantaneous desired signal. This voltage limit is established by the forward voltage drop of two parallel oppositely connected diodes which form part of the limiter circuit.

The interference pulses accompanying the desired signal are greatly reduced by limiting and filtering before the desired signal is used to establish the reference voltage for the limiter circuit. The distortion of the desired signal by the interference pulses is thereby greatly reduced.

The present invention will have particular usefulness in applications such as high subclutter visibility radar where distortion of the clutter signal results in spreading of clutter frequencies into the doppler passband or in imaging radar where a large dynamic range of the received signal must be handled. It will further find useful application where mutual interference rejection and rejection of other pulse transmitter signals is desired and for interference reduction in systems that use spread spectrum, FM, chirp, MTI, or doppler signal processing techniques.

DESCRIPTION OF THE PREFERRED EMBODIMENT

Figure 1:
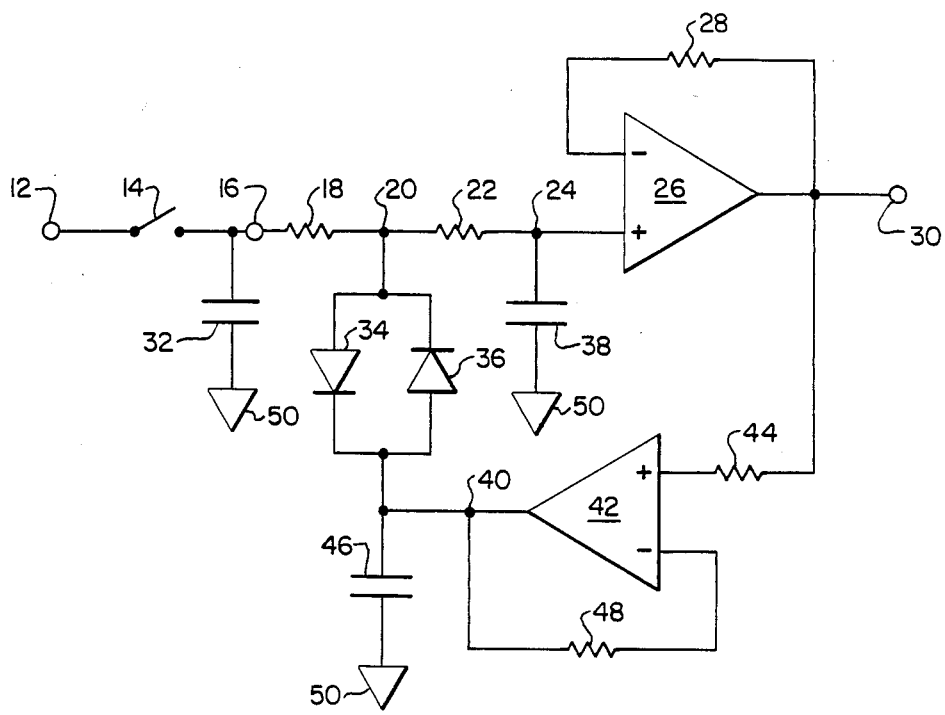
FIG. 1 of the drawing illustrates a preferred embodiment of a floating limiter circuit according to the present invention.

In the floating limiter circuit shown in FIG. 1, an input terminal 16 is connected to receive a signal from a sample and hold range gate comprised of switch 14 and capacitor 32. A sampling and hold range gate may be required when the limiter circuit of the present invention is used in a radar system.

A resistor 18 is connected between input terminal 16 and a junction 20, which in turn is connected to the anode of a diode 34 and the cathode of a diode 36. The other electrodes of the respective two diodes are connected to a common junction 40 and to one end of a capacitor 46, the other end of which is connected to ground terminal 50. A resistor 22 connects junction 20 to the positive input of a buffer amplifier 26 and to one end of a capacitor 38, the other end of which is connected to ground terminal 50. The output of amplifier 26 is connected to an output terminal 30 and through a feedback loop comprising a resistor 28 to the negative input of buffer amplifier 26. The output of amplifier 26 is further connected to the positive input of a buffer amplifier 42 through a resistor 44. The output of amplifier 42 is connected to the junction point 40 and, through a feedback loop comprising a resistor 48, to the negative input of amplifier 42.

In the absence of interfering pulses, the voltage at junction point 20 is approximately equal to the voltage at input terminal 16. Resistor 22 and capacitor 38 form a low pass filter with sufficient bandwidth to pass the desired signal, thus providing a voltage at the positive input of amplifier 26 which follows the instantaneous desired signal received at input terminal 16. Buffer amplifiers 26 and 42 have a unity gain and thus produce a voltage at junction point 40 which is equal to the voltage at the positive input of amplifier 26. The voltage at junction 40 provides a reference for the limiter circuit comprised of diodes 34 and 36 and resistor 18. Since the reference voltage at junction point 40 is approximately equal to the instantaneous sample voltage at input terminal 16, diodes 34 and 36, in the absence of interfering pulses, will normally not conduct.

Figure 2:
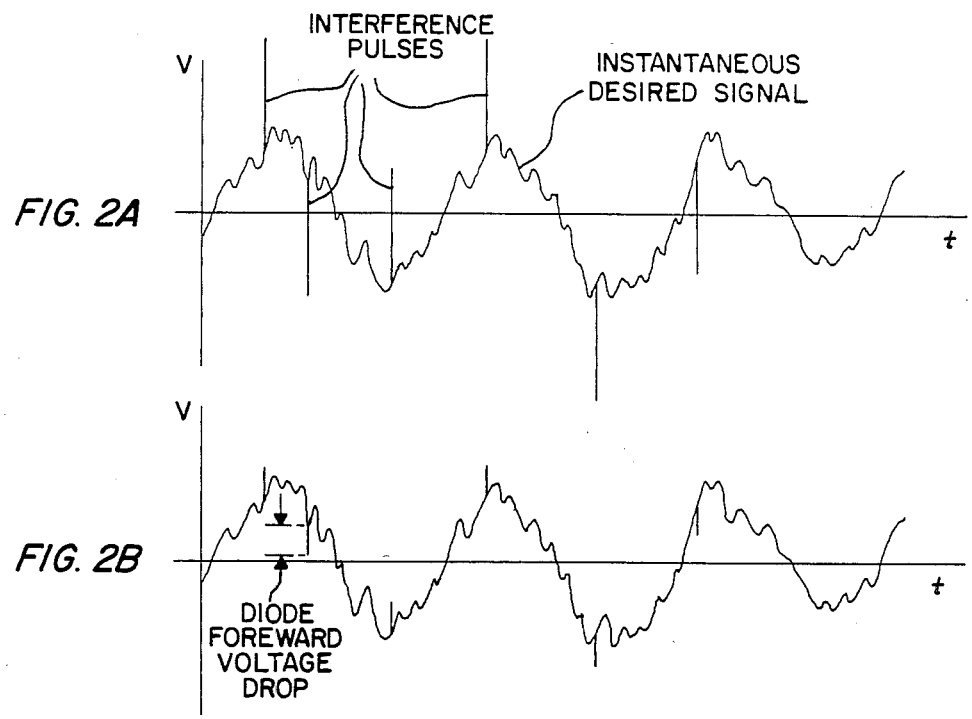
FIG. 2A of the drawing illustrates a typical signal appearing at the input of the floating limiter circuit.
FIG. 2B illustrates the same signal after the interference pulses have been limited by the limiter circuit.

A typical signal which might be received at input terminal 16 is shown in FIG. 2A of the drawing. When an interference pulse is received at input terminal 16, the voltage at input terminal 16 equals the sum of the desired signal and the interference signal. If the sum voltage at input terminal 16 exceeds the envelope reference voltage at junction 40 by more than the forward voltage drop of diodes 34 and 36, one of the two diodes will conduct and limit the voltage at junction 20 to within the forward voltage drop of the diodes in either direction of the instantaneous desired signal. The signal appearing at junction 20, with the interference pulses limited, is illustrated in FIG. 2B of the drawing. Resistor 18 provides a high impedance to the input of the circuit to prevent excessive current flow when one of diodes 34 or 36 conducts.

Buffer amplifier 42 isolates junction 40 from output terminal 30 and thus prevents distortion of the desired output signal at output terminal 30 by instantaneous current fluctuations at junction 40 when iodes 34 or 36 are caused to conduct in response to an interference pulse. Capacitor 46 provides near zero impedance for very narrow or fast rise time pulses and is essential for high speed operation of the limiter circuit. Since the limiting action does not depend on the frequency response or dynamic range of the buffer amplifiers 26 and 42, the limiter circuit can respond to very large and/or very narrow or fast rise time pulses.

Under most conditions, the phase difference between the desired signal and the interference pulses is random. In such case, the polarity of the limited interference pulse at junction 20 is random and its amplitude is not exceeding the forward voltage drop of diodes 34 and 36. This random polarity voltage is a broadband noise-like signal and only a small portion of its energy falls within the information band width of the receiver. The resulting signal-to-interference ratio is high even when the amplitude of the interference signal greatly exceeds the desired signal.

What is claimed is:

1. A floating limiter circuit for reducing interference pulses in a signal, comprising:
   circuit input and circuit output;
   first and second buffer amplifiers, each having an input and output;
   a low pass filter having its input connected to the circuit input and having its output connected to the input of said first buffer amplifier;
   a pair of diodes connected in parallel and in opposite polarity between the input of said low pass filter and the output of said second buffer amplifier;
   means connecting the output of said first buffer amplifier to said circuit output and to the input of said second buffer amplifier; and
   a capacitor connected between said output of said second buffer amplifier and a source of reference potential,
   whereby the voltage at the output of said second buffer amplifier is equal to the envelope amplitude of the signal appearing at the input of said low pass filter and any interference pulses appearing at the circuit input are limited by the action of said pair of diodes and prevented from distorting the desired signal at the circuit output.

2. Apparatus according to claim 1, wherein a resistor is connected between the circuit input and the input of said low pass filter.

* * * * *